April 15, 1958 D. C. WELLER 2,831,113

TRANSISTOR RELAXATION CIRCUITS

Filed Oct. 14, 1954

INVENTOR
D. C. WELLER

BY R. B. Ardis

ATTORNEY

United States Patent Office 2,831,113
Patented Apr. 15, 1958

2,831,113

TRANSISTOR RELAXATION CIRCUITS

David C. Weller, Lake Mohawk, N. J., assignor to Bell Telephone Laboratories, Incorporated, New York, N. Y., a corporation of New York Application October 14, 1954, Serial No. 462,153
12 Claims. (Cl. 250—36)

This invention relates generally to transistor relaxation circuits and more particularly, although in its broader aspects not exclusively, to transistor relaxation circuits intended for operation at a relatively high power level.

A principal object of the invention is to increase the power obtainable from a transistor relaxation circuit in as simple and economical a manner as possible.

Another and more particular object is to free the duty cycle of a high power transistor relaxation oscillator from dependence upon the load impedance.

Still another object is to permit a high power transistor flip-flop circuit to be triggered readily by input pulses of relatively low power.

In previous high power transistor relaxation oscillators, the duty cycle (i. e., the ratio of "on" time to the total of "on" time and "off" time) has tended to be dependent upon load impedance. A large load impedance has tended to decrease the duty cycle and, hence, reduce both the output power and the fundamental frequency, while a small load impedance has tended to have the opposite effect. In addition, previous high power transistor relaxation circuits have tended to require a relatively large amount of power for their operation. In a relaxation oscillator, this high operating power requirement has tended to detract from the output power provided by the circuit, while in a bistable or flip-flop circuit, it has tended not only to detract from output power but also to make a relatively high level of input pulse power necessary for triggering.

The present invention overcomes these disadvantages of the prior art and permits the duty cycle of a high power transistor relaxation oscillator to be freed from any substantial dependence upon load impedance. In addition, it reduces the operating power requirements of transistor relaxation circuits and permits two-transistor high power relaxation circuits to be operated with only a single high power transistor, the remaining transistor being a smaller and less expensive transistor with only a relatively low power handling capacity.

In a principal aspect, the invention takes the form of a two-transistor relaxation circuit in which both transistors have internal impedances between their emitter and collector electrodes which approach open-circuits for zero base current and approach short-circuits for small positive values of base current. The second of the two transistors has a high power handling capacity relative to the first and a suitable output circuit intercouples its emitter-collector path with a source of D.-C. power. The first transistor is biased to an unstable point between its high and low impedance conditions, and coupling means is provided to switch the second transistor to its low impedance condition whenever the first transistor is in its low impedance condition and to its high impedance condition whenever the first transistor is in its high impedance condition. A feedback coupling from the second transistor to the first maintains the latter, at least initially, in its low impedance state whenever the former is in its low impedance state and in its high impedance state whenever the former is in its high impedance state. The impedance of the control path for the first transistor is much greater than the load impedance, with the result that it draws only an insignificant amount of power from the output circuit.

In a relaxation oscillator embodying the invention, the feedback coupling path from the second transistor to the first includes a timing capacitor which makes the relaxation circuit free-running. The first transistor is switched to its low impedance condition while the timing capacitor is being charged and to its low impedance condition while the timing capacitor is being discharged. Since the load impedance is small in comparison with the impedance of the control path for the first transistor, the duty cycle of the oscillator is substantially independent thereof and any tendency of changes of load impedance to change the output power and fundamental frequency of the oscillator output is avoided.

In a bistable or flip-flop circuit embodying the invention, the timing capacitor of the relaxation oscillator is replaced by a short-circuit. The circuit is then stable either when both transistors are in their low impedance states or when both transistors are in their high impedance states. Low power signal pulses of one polarity are applied to the first transistor to switch both transistors to their low impedance states, and similar pulses of the opposite polarity are applied to the first transistor to switch both transistors to their high impedance states. The drain of the feedback path to the first transistor is negligible even while both transistors are in their low impedance conditions, permitting maximum power to be applied to the output circuit. In addition, the small power requirements for operating the first transistor permit low power pulses applied to it to control readily the much greater amount of power in the circuit including the output circuit and the second transistor.

In accordance with a particular feature of the invention, the two transistors are of opposite conductivity type and have current amplification factors differing from unity in the same sense. The first requirements of the various portions of the basic transistor relaxation circuit are thereby met with a maximum simplicity. In at least one embodiment of the invention, one transistor is a junction transistor of the n-p-n type while the other is a junction transistor of the p-n-p type.

In its relaxation oscillator embodiments, the invention is also featured by a parallel resistance and capacitance connected in the interstage coupling circuit between the collector electrode of the first transistor and the base electrode of the second. These elements provide a relatively small voltage at the collector electrode of the first transistor and permit a high current to flow in the control circuit for the second without damaging the first transistor. The use of a relatively low power first transistor to control the relatively high power second transistor is thereby made feasible, permitting the numerous advantages of the present invention to be secured. In bistable or flip-flop circuits embodying the invention, this feature serves to permit optimum switching speed from one state to the other.

In accordance with still another feature of the invention in relaxation oscillator embodiments, a crystal diode is connected in parallel with a resistance in the feedback path from the second transistor to the first in order to equalize the input impedance of the first transistor from the standpoint of linearity. The resistances through which the timing capacitor charges and discharges are thereby equalized, making the oscillator output substantially a square wave.

A more complete understanding of the invention may be obtained from a study of the following detailed discussion of several specific embodiments.

Figure 1:
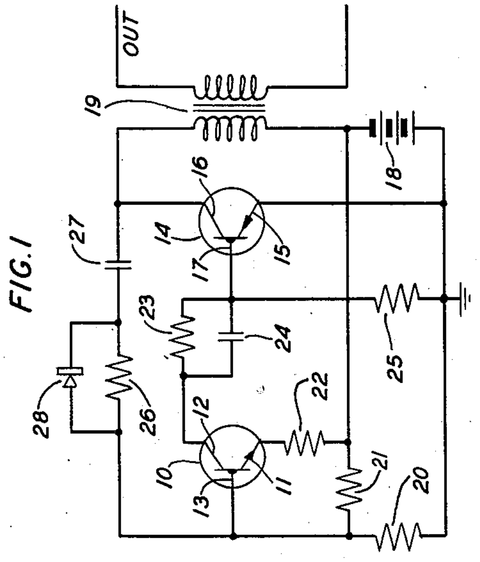
Fig. 1 illustrates a relaxation oscillator embodying the several features of the invention.

The embodiment of the invention illustrated in Fig. 1 is a relaxation oscillator which includes a pair of transistors 10 and 14. Transistor 10 has an emitter electrode 11, a collector electrode 12, and a base electrode 13 while transistor 14 has an emitter electrode 15, a collector electrode 16, and a base electrode 17. Transistor 14 has a high power-handling capacity relative to transistor 10. The two transistors are of opposite conductivity types and have current amplification factors which are less than unity. By way of example, transistor 10 is a junction transistor of the n-p-n type, and transistor 14 is a junction transistor of the p-n-p type. Transistor conductivity types may be reversed from those shown, however, if diode and D.-C. power supply polarities are also reversed.

A D.-C. power source, conventionally represented by a battery 18, is connected in series with the primary winding of an output transformer 19 between the emitter and collector electrodes of high power transistor 14. The emitter electrode of transistor 14 is grounded, and source 18 is poled to transmit current through transistor 14 in the direction from the emitter electrode to the collector electrode.

In accordance with a principal feature of the invention, transistors 10 and 14 are connected to present internal impedances between their emitter and collector electrodes which approach an open-circuit for zero base currents and which approach short-circuits for small positive base currents. So connected, transistors 10 and 14 form two-position switches which pass current freely when closed and block current almost completely when open.

In the embodiment of the invention illustrated in Fig. 1, transistor 10 is biased to its low impedance condition by a pair of resistors 20 and 21 connected in series across D.-C. source 18. Resistor 20 is the larger of the two resistors and has one side connected to ground, while the mid-point between resistors 20 and 21 is connected to the base electrode of transistor 10. A very small resistor 22 is connected between the emitter electrode of transistor 10 and the other side of resistor 21, furnishing a small amount of inverse feedback and permitting substantially uniform circuit operation with different transistors.

The interstage coupling circuit between transistors 10 and 14 in Fig. 1 is composed of a potential dropping resistor 23 and a bypass capacitor 24 connected in parallel between the collector electrode of low power transistor 10 and the base electrode of high power transistor 14. A small resistor 25 is returned to ground from the base electrode of transistor 14 to limit the input impedance of the second stage.

In the feedback path from the collector electrode of high power transistor 14 to the base electrode of low power transistor 10, a resistor 26 is connected in series with a timing capacitor 27 to make the relaxation circuit free-running. A crystal diode 28, poled in the direction from transistor 10 towards transistor 14, is connected in parallel with resistance 26 to correct the input impedance characteristics of low power transistor 10, permitting capacitor 27 to charge and discharge at equal rates.

In the operation of the embodiment of the invention illustrated in Fig. 1, the feedback signal applied to the base electrode of low power transistor 10 is of such a magnitude that transistor 10 functions as a two-position switch. In other words, the impedance looking into its collector and emitter terminals is either very high or very low. When transistor 10 begins to switch to its low impedance or short-circuit condition, current flows from D.-C. source 18 through the interstage path including resistor 23 and capacitor 24 and through the internal base-emitter path of transistor 10. This current tends to switch transistor 14 to its low impedance condition, causing current to begin to flow around the path including the internal emitter-collector path of transistor 14 and the primary winding of output transformer 19. This latter path is the main power path of the relaxation oscillator, and the voltage appearing across the primary winding of transformer 19 is transmitted therethrough to the secondary winding and the useful load.

As the current through the internal emitter-collector path of transistor 14 and the primary winding of output transformer 19 builds up, a transient current flows through timing capacitor 27 and resistor 26 to the base electrode of transistor 10. This transient current is in the direction to force the internal collector-emitter path of transistor 10 to conduct more heavily, and the increased current resulting in the internal collector-emitter path of transistor 10 tends in turn to cause transistor 14 to conduct more heavily. As a result, the voltage at the collector electrode of transistor 14 rises sharply until both transistors become saturated. The transient current through timing capacitor 27 then begins to decrease exponentially as capacitor 27 is charged. The voltage at the collector electrode of transistor 14 (the output voltage of the oscillator) remains constant while timing capacitor 27 is being charged.

By the time capacitor 27 is fully charged, the transient current through it in the direction toward the base electrode of transistor 10 has decreased to zero, returning the bias on transistor 10 to an unstable point between open- and short-circuit conditions of the transistor. Transistor 10 then tends to switch to its high impedance or open-circuit condition, decreasing the current flowing in its internal collector-emitter path. As this current decreases, the forward bias on the emitter electrode of high power transistor 14 decreases, causing its base current to drop toward zero and the impedance of its internal emitter-collector path to increase sharply. At this moment, timing capacitor 27 begins to discharge, largely through the path formed by the primary winding of transformer 19, biasing resistor 21, and diode 28. This tends to reverse the emitter bias on low power transistor 10, switching the transistor still further into its high impedance or open-circuit condition. The reaction is cumulative, and, as a result, both transistors 10 and 14 attain higher and higher impedances in their internal emitter-collector paths until, finally, the current forced through the internal emitter-collector path of transistor 14 and the primary winding of transformer 19 by source 18 drops to zero.

Transistor 10 is held in its high impedance or open-circuit condition as long as timing capacitor 27 continues to discharge. When capacitor 27 ceases to discharge, however, the biasing current through resistor 21 which tended to maintain transistor 10 in its high impedance condition has decayed to zero, and transistor 10 has once again reached an unstable point between the high and low impedance conditions. Transistor 10 then tends to switch once more to its low impedance condition, and the operation repeats itself. When in its low impedance condition, transistor 10 switches transistor 14 to its low impedance condition, causing another large pulse of current to build up in the power path through the internal emitter-collector path of transistor 14 and the primary winding of transformer 19. As before, this pulse continues until timing capacitor 27 becomes fully charged, at which time the two transistors shut each other off once again, and timing capacitor 27 discharges.

Figure 2:
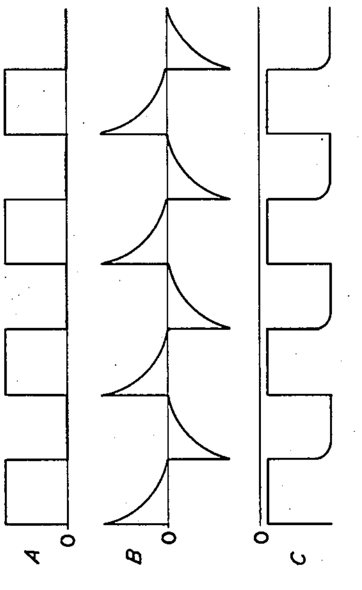
Fig. 2 shows several of the current and voltage wave-forms appearing in the embodiment of the invention illustrated in Fig. 1.

The operation which has been described is illustrated by the current and voltage wave-forms shown in Fig. 2. In Fig. 2, the upper wave-form A represents the current flowing through interstage capacitor 24, the middle wave-form B represents the current flowing through timing capacitor 27, and the lower wave-form C represents the voltage at the collector electrode of transistor 14 and, hence, the output voltage of the relaxation oscillator.

As illustrated in Fig. 2, the current through interstage capacitor 24 rises sharply as low power transistor 10 is switched to its low impedance or short-circuit condition. Once both transistors become saturated, it remains substantially constant until, through the action of timing capacitor 27, transistor 10 is switched back to its high impedance or short-circuit condition. The current through capacitor 24 then drops sharply to zero and remains there until transistor 10 is switched once again to its low impedance condition. The current through timing capacitor 27, as illustrated by the middle wave-form B of Fig. 2, rises sharply to a maximum value during the instant in which transistors 10 and 14 are switched to their low impedance or short-circuit conditions. As capacitor 27 charges, however, this current decreases exponentially towards zero. When the current through timing capacitor 27 has dropped substantially to zero, transistors 10 and 14 are switched back to their high impedance or open-circuit conditions, and the current through capacitor 27 reverses and flows in the opposite direction. This discharge current likewise diminishes exponentially with time. When the discharge current forced through transformer 19 and biasing resistor 21 by capacitor 27 has dropped to zero, transistors 10 and 14 are once agains switched to their low impedance conditions, and the operation repeats.

As illustrated at the bottom of Fig. 2, the voltage at the collector electrode of transistor 14 rises sharply towards ground when the transistors are switched to their low impedance or short-circuit conditions. This voltage then remains constant at its maximum value while timing capacitor 27 is being charged but decreases sharply to zero while timing capacitor 27 is discharging. The resulting voltage wave-form at the collector electrode of transistor 14 is substantially a square wave, the fundamental frequency of which is determined by the charging and discharging time of capacitor 27. This wave-form is applied through output transformer 19 to the circuit load.

A principal feature of the invention permits the duty cycle of the output voltage wave-form of the relaxation oscillator shown in Fig. 1 to be substantially independent of the load impedance presented to the circuit through transformer 19. The impedance provided by the primary winding of transformer 19 is very small in comparison with the impedances of the charging and discharging paths for timing capacitor 27. The charging and discharging times of capacitor 27 are, therefore, substantially unaffected by changes in load impedance. Since the duty cycle of the oscillator is unaffected by changes in load impedance, so also are the fundamental frequency and power content of the output wave.

Since transistor 10 has a low power handling capacity relative to transistor 14, only a very small amount of power is required to switch it between its high and low impedance states. This permits the use of the relatively high impedance feedback path between transistor 14 and transistor 10 mentioned above and results in only a very small power drain from the load for switching purposes. Substantially full power from D.-C. source 18 is, therefore, available for application to the load.

In the interstage circuit between transistors 10 and 14, however, the problem is just the opposite and transistor 14 requires a substantially greater amount of power to switch between its high and low impedance conditions than does transistor 10. In accordance with another feature of the invention, interstage resistor 27 is provided to limit the voltage at the collector electrode of transistor 10 to a relatively low value. This permits a relatively large current to flow through the internal collector-emitter path of transistor 10 without exceeding the power handling capacity of the transistor. This current is large enough to switch high power transistor 14 to its low impedance state and permit the relaxation oscillator to operate in its intended manner.

The following circuit element values are given, by way of example, for the relaxation oscillator embodiment of the invention shown in Fig. 1:

| | |
|---|---|
| Transistor 10 | 1853-type n-p-n transistor. |
| Transistor 14 | 1777-type p-n-p transistor. |
| D.C. source 18 | −20 volts. |
| Transformer 19 | 70:15,800 ohms. |
| Resistor 20 | 20,000 ohms. |
| Resistor 21 | 1000 ohms. |
| Resistor 22 | 10 ohms. |
| Resistor 23 | 510 ohms. |
| Capacitor 24 | 25 microfarads. |
| Resistor 25 | 200 ohms. |
| Resistor 26 | 910 ohms. |
| Capacitor 27 | 0.047 microfarad. |

For the above values, the oscillator operates at a 3000-cycle fundamental frequency and delivers approximately three watts of power.

Figure 3:
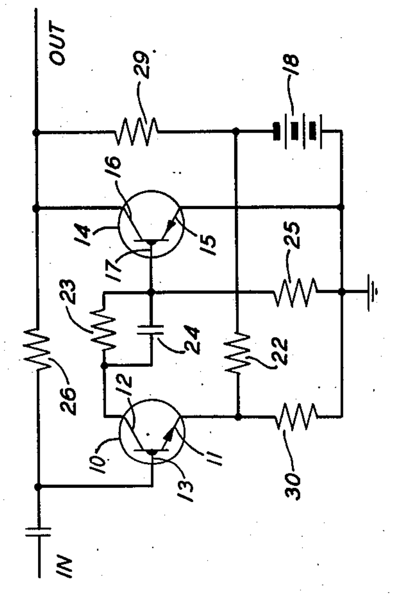
Fig. 3 shows a bistable or flip-flop circuit embodying various features of the invention.

The embodiment of the invention illustrated in Fig. 3 is a bistable or flip-flop circuit. It is the same as the relaxation oscillator of Fig. 1, with the exception that in the feedback path between transistors 14 and 10, timing capacitor 27 is replaced by a short-circuit, power output transformer 19 is replaced by a load resistor 29, varistor 28 is removed, biasing resistors 21 and 22 are removed, and a resistor 30 is added. A signal input lead is connected to the base electrode of low power transistor 10, and resistor 30 is returned directly to ground from the emitter electrode of transistor 10.

The embodiment of the invention illustrated in Fig. 3 has two stable states of equilibrium, an "on" state when both transistors are in their low impedance conditions and an "off" state when both transistors are in their high impedance conditions. The circuit is turned "on" from its "off" state by a positive voltage pulse at the base electrode of transistor 10, "off" from its "on" state by a negative voltage pulse at the base electrode of transistor 10. A positive triggering pulse at the base electrode of transistor 10 has no effect when the circuit is already in its "on" state. The same is true for a negative pulse appearing when the circuit is already in its "off" state.

Figure 4:
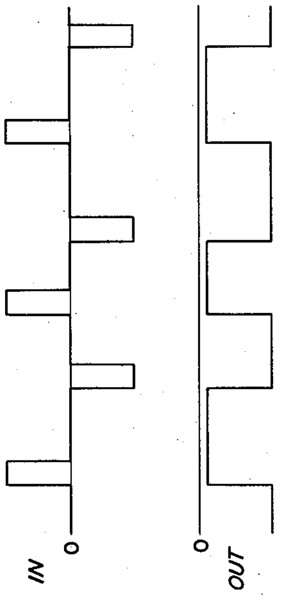
Fig. 4 shows input and output voltage wave-forms appearing in the embodiment of the invention illustrated in Fig. 3.

The operation of the bistable circuit illustrated in Fig. 3 is illustrated by the voltage wave-forms of Fig. 4. The upper or input wave-form is shown as a series of alternate positive and negative voltage pulses which may be applied to the input circuit of the bistable circuit shown in Fig. 3 to turn it alternately "on" and "off," while the lower or output wave-form represents the resulting output voltage appearing at the collector electrode of transistor 14. As shown in Fig. 4, each positive input pulse switches the circuit "on" and each succeeding negative pulse switches it "off."

The present invention permits a much larger amount of power to be controlled in the output path of the flip-flop circuit illustrated in Fig. 3 by triggering pulses of relatively low power. The resistance of load resistor 29 is small in comparison with the impedance of the feedback path by which low power transistor 10 is controlled from high power transistor 14. Not only is a substantially negligible amount of power drawn from the load circuit to maintain transistor 10 in its open- and short-circuit conditions, respectively, but transistor 10 is itself of sufficiently low power capacity to permit it to be switched between its high and low impedance states by triggering pulses of relatively low power. Resistor 23 and its parallel capacitor 24 in the interstage circuit limit the saturation current of transistor 10 and permit a sufficiently large transient current to flow in the internal collector-emitter path of transistor 10 to insure operation of transistor 14 and still avoid overloading the transistor 10 during "on" intervals. Because of the large difference in power level between the input of transistor 10 and the output of transistor 14, resistors 26, 22, and 30 are chosen to provide adequate margins against false circuit operation.

It is to be understood that the arrangements which have been described are illustrative of the application of the principles of the invention. Numerous other arrangements may be devised by those skilled in the art without departing from the spirit and scope of the invention.

What is claimed is:

1. A relaxation circuit which comprises, in combination, first and second transistors each having an emitter electrode, a collector electrode, a base electrode, and an internal impedance between its emitter and collector electrodes which is very large for zero base current and very small for small values of positive base current, a source of direct current power, an output circuit intercoupling said source and the emitter and collector electrodes of said second transistor, means to bias said first transistor to a point between its high and low impedance conditions, coupling means between the collector electrode of said first transistor and the base electrode of said second transistor to switch said second transistor to its low impedance condition whenever said first transistor is in its low impedance condition and to its high impedance condition whenever said first transistor is in its high impedance condition, and feedback coupling means between the collector electrode of said second transistor and the base electrode of said first transistor to maintain, at least initially, said first transistor in its low impedance condition whenever said second transistor is in its low impedance condition and in its high impedance condition whenever said second transistor is in its high impedance condition.

2. A relaxation oscillator which comprises, in combination, first and second transistors each having an emitter electrode, a collector electrode, a base electrode, and an internal impedance between its emitter and collector electrodes which is very large for zero base current and very small for small values of positive base current, a source of direct current power, an output circuit intercoupling said source and the emitter and collector electrodes of said second transistor, means to bias said first transistor to a point between its high and low impedance conditions, coupling means between the collector electrode of said first transistor and the base electrode of said second transistor to switch said second transistor to its low impedance condition whenever said first transistor is in its low impedance condition and to its high impedance condition whenever said first transistor is in its high impedance condition, and feedback coupling means including a timing capacitor between the collector electrode of said second transistor and the base electrode of said first transistor to maintain, at least initially, said first transistor in its low impedance condition whenever said second transistor is in its low impedance condition and in its high impedance condition whenever said second transistor is in its high impedance condition, whereby said first transistor is switched to its low impedance condition while said capacitor is being charged and to its high impedance condition while said capacitor is being discharged.

3. A bistable circuit which comprises, in combination, first and second transistors each having an emitter electrode, a collector electrode, a base electrode, and an internal impedance between its emitter and collector electrodes which is very large for zero base current and very small for small values of positive base current, a source of direct current power, an output circuit intercoupling said source and the emitter and collector electrodes of said second transistor, means to bias said first transistor to a point between its high and low impedance conditions, coupling means between the collector electrode of said first transistor and the base electrode of said second transistor to switch said second transistor to its low impedance condition whenever said first transistor is in its low impedance condition and to its high impedance condition whenever said first transistor is in its high impedance condition, feedback coupling means between the collector electrode of said second transistor and the base electrode of said first transistor to maintain said first transistor in its low impedance condition whenever said second transistor is in its low impedance condition and in its high impedance condition whenever said second transistor is in its high impedance condtion, and means to apply trigger voltages between the base and emitter electrodes of said first transistor, whereby a trigger pulse of one polarity tends to switch both of said transistors to their low impedance conditions and a trigger pulse of the opposite polarity tends to switch both of said transistors to their high impedance conditions.

4. A relaxation circuit which comprises, in combination, first and second transistors of opposite conductivity type having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes of said second transistor, means to bias said first transistor to a point between its open and short-circuit conditions, coupling means between the collector electrode of said first transistor and the base electrode of said second transistor to switch said second transistor to its short-circuit condition whenever said first transistor is in its short-circuit condition and to its open-circuit condition whenever said first transistor is in its open-circuit condition, and feedback coupling means between the collector electrode of said second transistor and the base electrode of said first transistor to maintain, at least initially, said first transistor in its short-circuit condition whenever said second transistor is in its short-circuit condition and in its open-circuit condition whenever said second transistor is in its open-circuit condition.

5. A relaxation oscillator which comprises, in combination, first and second transistors of opposite conductivity type having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes of said second transistor, means to bias said first transistor to a point between its open and short-circuit conditions, coupling means between the collector electrode of said first transistor and the base electrode of said second transistor to switch said second transistor to its short-circuit condition whenever said first transistor is in its short-circuit condition and to its open-circuit condition whenever said first transistor is in its open-circuit condition, and feedback coupling means including a timing capacitor between the collector electrode of said second transistor and the base electrode of said first transistor to maintain initially said first transistor in its short-circuit condition whenever said second transistor is in its short-circuit condition and in its open-circuit condition whenever said second transistor is in its open-circuit condition, whereby said first transistor is switched to its short-circuit condition while said capactor is being charged and to its open-circuit condition while said capacitor is being discharged.

6. A bistable circuit which comprises, in combination, first and second transistors of opposite conductivity type having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes of said second transistor, means to bias said first transistor to a point between its open and short-circuit conditions, coupling means between the collector electrode of said first transistor and the base electrode of said second transistor to switch said second transistor to its short-circuit condition whenever said first transistor is in its short-circuit condition and to its open-circuit condition whenever said first transistor is in its open-circuit condition, and feedback coupling means between the collector electrode of said second transistor and the base electrode of said first transistor to maintain said first transistor in its short-circuit condition whenever said second transistor is in its short-circuit condition and in its open-circuit condition whenever said second transistor is in its open-circuit condition, and means to apply trigger voltages between the base and emitter electrodes of said first transistor, whereby a trigger pulse of one polarity tends to switch both of said transistors to their short-circuit conditions and a trigger pulse of the opposite polarity tends to switch both of said transistors to their open-circuit conditions.

7. A relaxation circuit which comprises, in combination, first and second transistor switches each having a low impedance condition and a high impedance condition, a source of direct current power, an output circuit intercoupling said source and said second transistor switch, means to bias said first transistor switch to a point between its low and high impedance conditions, coupling means between said first and second transistor switches to turn said second switch to its low impedance condition whenever said first switch is in its low impedance condition and to its high impedance condition whenever said first switch is in its high impedance condition, and feedback coupling means between said second and first transistor switches to maintain, at least initially, said first switch in its low impedance condition whenever said second switch is in its low impedance condition and in its high impedance condition whenever said second switch is in its high impedance condition.

8. A relaxation oscillator which comprises, in combination, first and second transistor switches each having a low impedance condition and a high impedance condition, a source of direct current power, an output circuit intercoupling said source and said second transistor switch, means to bias said first transistor switch to a point between its low and high impedance conditions, coupling means between said first and second transistor switches to turn said second switch to its low impedance condition whenever said first switch is in its low impedance condition and to its high impedance condition whenever said first switch is in its high impedance condition, and feedback coupling means including a timing capacitor between said second and first transistor switches to maintain initially said first switch in its low impedance condition whenever said first switch is in its low impedance condition and in its high impedance condition whenever said second switch is in its high impedance condition, whereby said first switch is turned to its low impedance condition while said capacitor is being charged and to its high impedance condition while said capacitor is being discharged.

9. A bistable circuit which comprises, in combination, first and second transistor switches each having a low impedance condition and a high impedance condition, a source of direct current power, an output circuit intercoupling said source and said second transistor switch, means to bias said first transistor switch to a point between its low and high impedance conditions, coupling means between said first and second transistor switches to turn said second switch to its low impedance condition whenever said first switch is in its low impedance condition and to its high impedance condition whenever said first switch is in its high impedance condition, feedback coupling means between said second and first transistor switches to maintain said first switch in its low impedance condition whenever said second switch is in its low impedance condition and in its high impedance condition whenever said second switch is in its high impedance condition, and means to apply trigger voltages to said first transistor switch, whereby a trigger pulse of one polarity tends to turn both of said switches to their low impedance conditions and a trigger pulse of the opposite polarity tends to turn both of said switches to their high impedance conditions.

10. A relaxation circuit which comprises, in combination, first and second transistors of opposite conductivity type having relatively low and high power capacities, respectively, and having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes of said second transistor, means to bias said first transistor to a point between its open and short-circuit conditions, coupling means including a parallel resistance and capacitance connected between the collector electrode of said first transistor and the base electrode of said second transistor and a connection between the emitter electrode of said first transistor and said source to switch said second transistor to its short-circuit condition whenever said first transistor is in its short-circuit condition and to its open-circuit condition whenever said first transistor is in its open-circuit condition, and feedback coupling means including a resistance shunted by a diode poled toward said second transistor connected between the collector electrode of said second transistor and the base electrode of said first transistor to maintain, at least initially, said first transistor in its short-circuit condition whenever said second transistor is in its short-circuit condition and in its open-circuit condition whenever said second transistor is in its open-circuit condition, said diode substantially equalizing the input impedance characteristics of said first transistor.

11. A relaxation oscillator which comprises, in combination, first and second transistors of opposite conductivity type having relatively low and high power capacities, respectively, and having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes of said second transistor, means to bias said first transistor to a point between its open and short-circuit conditions, coupling means including a parallel resistance and capacitance connected between the collector electrode of said first transistor and the base electrode of said second transistor and a connection between the emitter electrode of said first transistor and said source to switch said second transistor to its short-circuit condition whenever said first transistor is in its short-circuit condition and to its open-circuit condition when ever said first transistor is in its open-circuit condition, and feedback coupling means including a resistance shunted by a diode poled toward said second transistor connected in series with a timing capacitor between the collector electrode of said second transistor and the base electrode of said first transistor to maintain, at least initially, said first transistor in its short-circuit condition whenever said second transistor is in its short-circuit condition and in its open-circuit condition whenever said second transistor is in its open-circuit condition, whereby said first transistor is switched to its short-circuit condition while said capacitor is being charged and to its open-circuit condition while said capacitor is being discharged, said diode substantially equalizing the input impedance characteristics of said first transistor.

12. A bistable circuit which comprises, in combination, first and second transistors of opposite conductivity type having relatively low and high power capacities, respectively, and having current amplification factors differing from unity in the same sense, each of said transistors having an emitter electrode, a collector electrode, a base electrode, and an internal impedance between its emitter and collector electrodes which approaches an open-circuit for zero base current and approaches a short-circuit for small values of positive base current, a source of direct current power, an output circuit intercoupling said source and the emitter and collector electrodes if said second transistor, means to bias said first transistor to a point between its open and short-circuit conditions, coupling means including a resistance connected between the collector electrode of said first transistor and the base electrode of said second transistor and a connection between the emitter electrode of said first transistor and said source to switch said second transistor to its short-circuit condition whenever said first transistor is in its short-circuit condition and to its open-circuit condition whenever said first transistor is in its open-circuit condition, feedback coupling means including a resistance connected between the collector electrode of said second transistor and the base electrode of said first transistor to maintain said first transistor in its short-circuit condition whenever said second transistor is in its short-circuit condition and in its open-circuit condition whenever said second transistor is in its open-circuit condition, and means to apply trigger pulses between the base and emitter electrodes of said first transistor, whereby a trigger pulse of one polarity tends to switch both of said transistors to their short-circuit conditions and a trigger pulse of the opposite polarity tends to switch both of said transistors to their open-circuit conditions.

References Cited in the file of this patent

UNITED STATES PATENTS 2,655,609 Shockley -------------- Oct. 13, 1953

OTHER REFERENCES

Article: "Junction Transistor Circuit Applications," by Sulzer, pages 170–173 of Electronics for August 1953.